United States Patent
Li et al.

(10) Patent No.: US 8,416,901 B2
(45) Date of Patent: Apr. 9, 2013

(54) METHOD AND APPARATUS FOR DETECTING CLOCK FREQUENCY DEVIATION

(75) Inventors: Bo Li, Shenzhen (CN); Shiqing Hu, Shenzhen (CN); Peng Chen, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 688 days.

(21) Appl. No.: 12/646,671

(22) Filed: Dec. 23, 2009

(65) Prior Publication Data

US 2010/0166131 A1    Jul. 1, 2010

(30) Foreign Application Priority Data

Dec. 26, 2008  (CN) .......................... 2008 1 0220460

(51) Int. Cl.
*H04L 7/00*    (2006.01)

(52) U.S. Cl.
USPC ............ 375/354; 375/360; 327/141; 327/160

(58) Field of Classification Search .................. 375/344, 375/354, 355, 360, 377; 327/141, 160
See application file for complete search history.

(56) References Cited

U.S. PATENT DOCUMENTS

| | | | |
|---|---|---|---|
| 4,975,594 A | 12/1990 | Wiren | |
| 5,930,294 A * | 7/1999 | Chapman | ...................... 375/213 |
| 2006/0114032 A1 | 6/2006 | Geer et al. | |
| 2008/0100388 A1 * | 5/2008 | Lin et al. | .......................... 331/44 |
| 2009/0147899 A1 * | 6/2009 | Arviv et al. | .................... 375/359 |

FOREIGN PATENT DOCUMENTS

CN  1449516 A  10/2003

OTHER PUBLICATIONS

Combined Search and Examination Report in corresponding European Application No. GB0921633.4 (Apr. 27, 2010).

* cited by examiner

*Primary Examiner* — Dac Ha
(74) *Attorney, Agent, or Firm* — Leydig, Voit & Mayer, Ltd.

(57) ABSTRACT

The embodiment of the present disclosure discloses a method and apparatus for detecting frequency deviation of a clock. The method includes: counting the clock to be detected to acquire current counting information; filtering the current counting information to acquire filtered data; and acquiring the frequency deviation of the clock to be detected from the filtered data. According to the embodiments of the present disclosure, the detection accuracy of frequency deviation is improved by filtering the counting information acquired by counting the clock to be detected, and appropriately increasing an amount of information after the filtering, so as to perceive the occurrence of any abnormal dithering, and avoid neglecting of any abnormal condition in periodic or aperiodic queries.

8 Claims, 4 Drawing Sheets

METHOD AND APPARATUS FOR DETECTING CLOCK FREQUENCY DEVIATION

CROSS-REFERENCE TO RELATED APPLICATIONS

This application claims priority to Chinese Patent Application No. 200810220460.X, filed on Dec. 26, 2008, which is hereby incorporated by reference in its entirety.

FIELD OF TECHNOLOGY

The present disclosure relates to the technical field of communication, and particularly, to a method and apparatus for detecting clock frequency deviation.

BACKGROUND OF THE DISCLOSURE

A clock signal is a very important signal in a communication system. The generation and transmission of various information nearly all depend on the clock, and the clock performance directly influences the performance of the entire communication system. Frequency deviation is one of the most common and important indicators of the clock performance.

The frequency deviation of a clock is generally described in two ways: absolute frequency deviation and relative frequency deviation. The absolute frequency deviation is the absolute value of a clock frequency deviation. For example, with respect to a standard frequency of 10 MHz, the absolute frequency deviation of a clock of 10.1 MHz is 100 KHz. The relative frequency deviation is a deviation percent of a clock frequency relative to the standard frequency. For example, with respect to a standard frequency of 10 MHz, the relative frequency deviation of a clock of 10.1 MHz is 1%. With respect to a certain fixed standard frequency, the absolute frequency deviation and the relative frequency deviation can be directly converted to each other.

An existing method for detecting frequency deviation uses a high frequency (HF) clock (hereinafter called as "counting clock") to count a low frequency (LF) clock to be detected, so as to determine how many cycles of the counting clock are there in one or more cycles of the LF clock to be detected, as shown in FIG. 1.

If the counting clock is the clock having a standard frequency $f_n$, and the counting result of counting the LF clock to be detected by the counting clock in one cycle is N, the actual frequency of the LF clock to be detected is $$\frac{f_n}{N},$$

and the deviation of the LF clock from the standard frequency $$f_x \text{ is } \left(\frac{f_n}{N} - f_x\right) / f_x = \frac{f_n}{N \cdot f_x} - 1.$$

In addition, when there is no HF clock that has a standard frequency, an LF clock having a standard frequency and the above mentioned counting clock may be adopted to count the clock to be detected, so as to acquire two counting results for comparison, and acquire the deviation of the clock to be detected, as shown in FIG. 2.

Provided that the frequency of the LF clock having a standard frequency is the expected standard frequency of the clock to be detected, the counting clock is adopted to count the clock having the standard frequency in one cycle, and the counting result is M, then the frequency deviation of the clock to be detected is $$\left(\frac{f_n}{M} - \frac{f_n}{N}\right) / \frac{f_n}{N} = \frac{N(N-M)}{MN} = \frac{N}{M} - 1.$$

The shortage of the existing technology is that in order to achieve a sufficient detection accuracy of frequency deviation, the multiple between the frequency of the clock to be detected and the frequency of the counting clock must be enough. For example, when the detection accuracy of frequency deviation is expected to be 1%, the frequency of the counting clock must be more than 100 times of the frequency of the clock to be detected; and when the accuracy is expected to be 0.01%, the multiple between the two frequencies must be more than 10,000. Thus the frequency of the counting clock shall be increased, or the frequency of the clock to be detected shall be decreased, while the former sometimes cannot be implemented during actual applications, and the latter brings a negative influence that the time for detection is increased.

SUMMARY OF THE DISCLOSURE

Embodiments of the present disclosure provide a method and apparatus for detecting clock frequency deviation, which improve the detection accuracy of frequency deviation by appropriately increasing an amount of information after filtering.

In order to solve the above technical problem, an embodiment of the present disclosure provides a method for detecting frequency deviation of a clock, including: (1) counting a clock to be detected to acquire current counting information; (2) filtering the current counting information to acquire filtered data; and (3) acquiring the frequency deviation of the clock to be detected from the filtered data.

Accordingly, an embodiment of the present disclosure provides an apparatus for detecting frequency deviation of a clock, including: (1) a counting unit, adapted to count the clock to be detected to acquire current counting information; (2) a filtering unit, adapted to filter the current counting information acquired by the counting unit to acquire filtered data; and (3) an acquiring unit, adapted to acquire a frequency deviation of the clock to be detected from the data filtered by the filtering unit.

According to the embodiments of the present disclosure, the detection accuracy of frequency deviation is improved by filtering the counting information acquired by counting the clock to be detected, and appropriately increasing an amount of information after the filtering, so as to perceive the occurrence of any abnormal dithering, and avoid neglecting of any abnormal condition in periodic or aperiodic queries.

BRIEF DESCRIPTION OF THE DRAWINGS

In order to clearly describe the technical solutions of the embodiments of the present disclosure or the existing technology, the drawings necessary for describing the embodiments or the existing technology are briefly introduced as follows. It is obvious that the following drawings are just some examples of the present disclosure, and a person skilled in the art can acquire other drawings based on those drawings without creative effort.

DETAILED DESCRIPTION OF THE DISCLOSURE

The technical solutions in the embodiments of the present disclosure are clearly and completely described as follows in conjunction with the drawings. Obviously, the described embodiments are just a part of the embodiments of the present disclosure, instead of all the embodiments. Based on the described solutions in the embodiments of the present disclosure, any other embodiment to be acquired by a person skilled in the art, without creative effort, is also within the scope of the disclosure as claimed.

Figure 3:
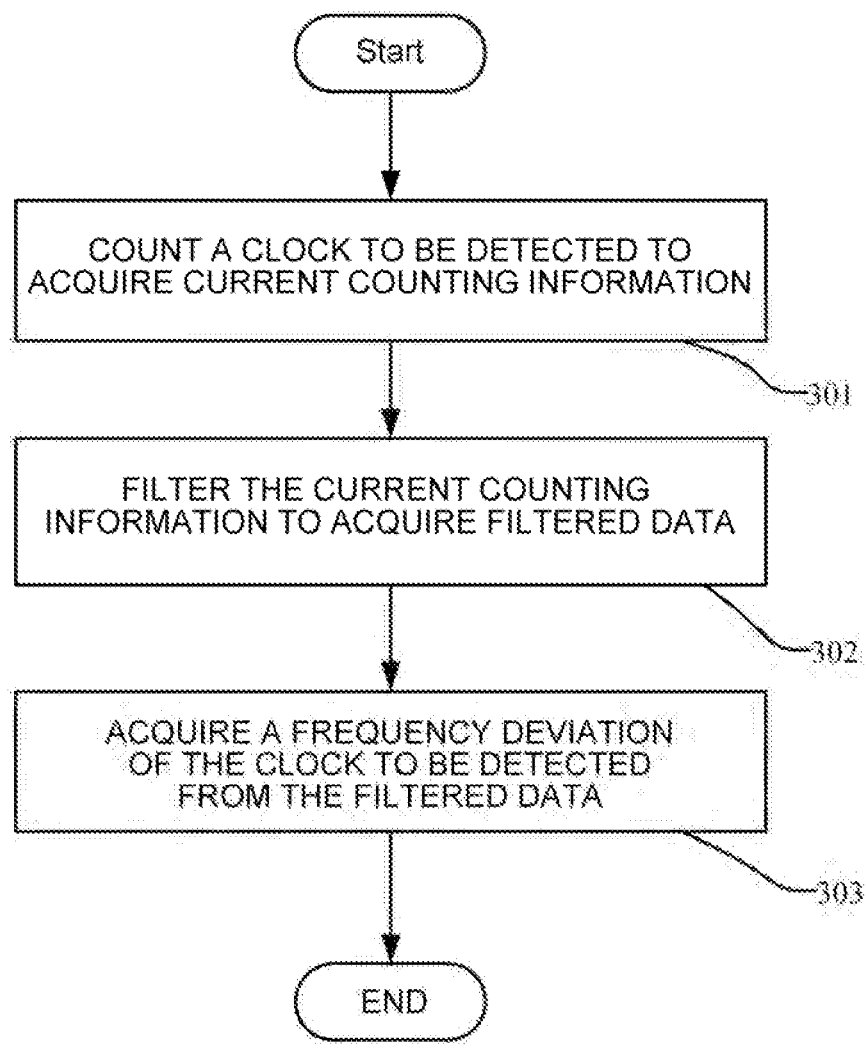
FIG. 3 is a flow diagram of a method for detecting clock frequency deviation according to a first embodiment of the present disclosure.

FIG. 3 is a flow diagram of a method for detecting clock frequency deviation according to a first embodiment of the present disclosure. The method is described as follows.

In step 301, a clock to be detected is counted to acquire current counting information.

In step 302, the current counting information is filtered to acquire filtered data.

Then, in step 303, a frequency deviation of the clock to be detected is acquired based on the filtered data.

In the embodiment, the counting information acquired by counting the clock to be detected is filtered, and the detection accuracy of the frequency deviation is improved by appropriately increasing an amount of information after the filtering. Thus, the occurrence of any abnormal dithering can be perceived so as to avoid neglecting of any abnormal condition in periodic or aperiodic queries.

Figure 4:
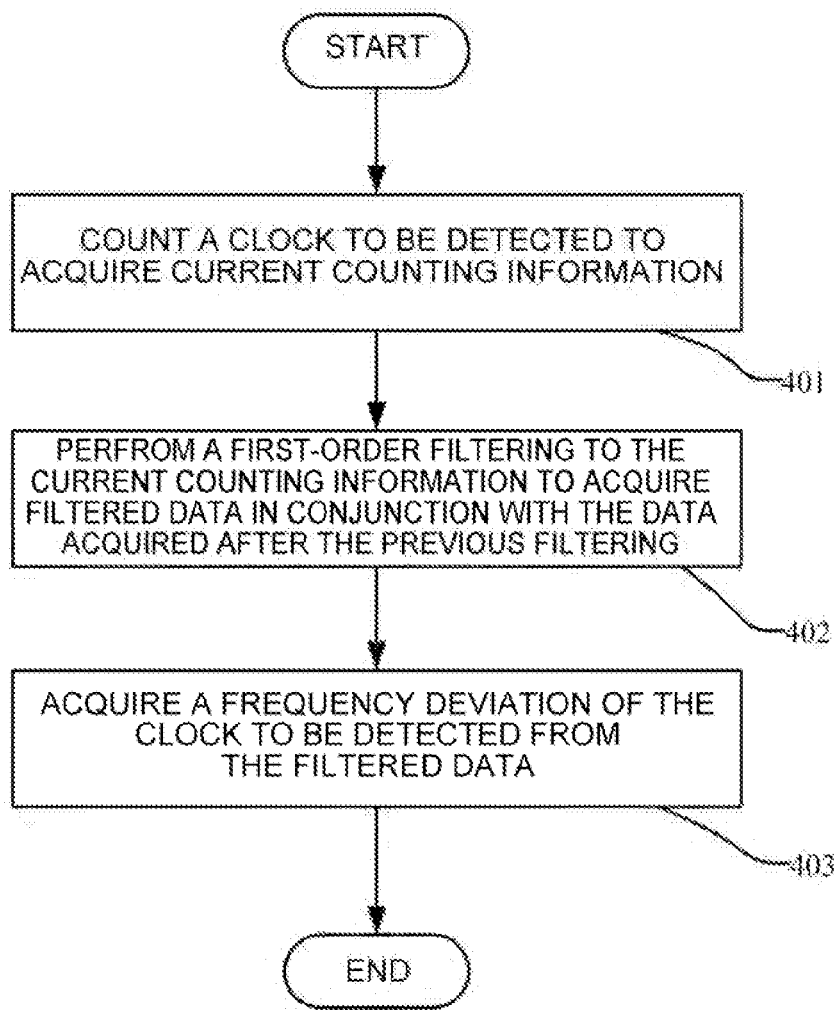
FIG. 4 is a flow diagram of a method for detecting clock frequency deviation according to a second embodiment of the present disclosure.

FIG. 4 is a flow diagram of a method for detecting clock frequency deviation according to a second embodiment of the present disclosure. The method is described with reference to FIG. 4 as follows.

In step 401, a clock to be detected is counted to acquire current counting information. The step may include: counting the clock to be detected to acquire the current counting information by a HF (high frequency) clock having a standard frequency, or counting the clock to be detected to acquire two pieces of current counting information by an LF clock having a standard frequency and an HF clock.

Figure 1:
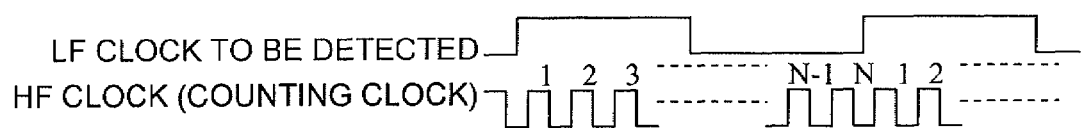
FIG. 1 is a schematic diagram in which a current HF clock having a standard frequency is utilized to count a clock to be detected.

Referring to FIG. 1, if the counting clock is a clock having a standard frequency of fn, and the counting result of counting the clock to be detected by the counting clock in one cycle is N, the actual frequency of the LF clock to be detected is $$\frac{f_n}{N}.$$

Figure 2:
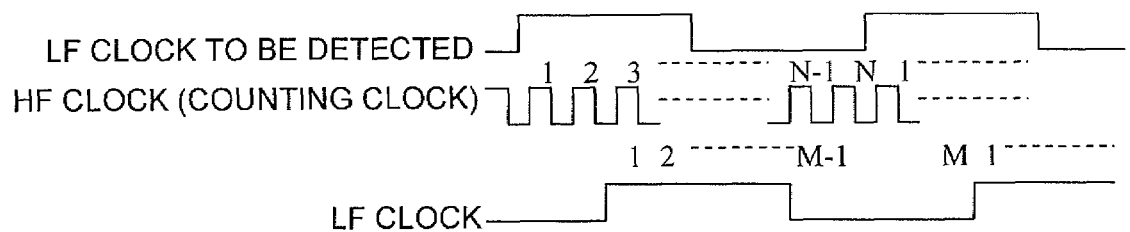
FIG. 2 is a schematic diagram in which a current LF clock having a standard frequency is utilized to count a clock to be detected.

In addition, when there is no HF clock that has a standard frequency, the LF clock having a standard frequency and the above mentioned counting clock may be adopted to count the clock to be detected, so as to acquire two counting results for comparison, and acquire the deviation of the clock to be detected, as shown in FIG. 2.

Provided that the frequency of the LF clock having a standard frequency is the expected standard frequency of the clock to be detected, the counting clock is adopted to count the clock having the standard frequency in one cycle, the counting result is M.

In step 402, filtered data is acquired based on the current counting information and the data acquired after the previous filtering.

In specific implementations, step 402 may include: acquiring filtered data based on the current counting information and the data acquired after the previous filtering. In the embodiment of the present disclosure, the filtered data may be part or the whole of the historical information, which can be acquired in an accumulation process to be mentioned in the embodiment of the present disclosure, and such data may be the data acquired after the previous accumulation, or initialized information.

In step 402, a first-order filtering is performed to N based on an equation $P_n = a \cdot P_{n-1} + N$.

In the equation of the step 402, n is a number of accumulations, N is nth counting information acquired by counting the clock to be detected by a standard frequency clock, $P_{n-1}$ is data acquired after n−1th filtering, $P_n$ is data acquired after nth filtering, $\alpha$ is a detection parameter, and $0 \leq \alpha < 1$. The detection parameter $\alpha$ can be set randomly in a certain range upon requirement. The embodiment of the present disclosure adopts the detection parameter $\alpha$, and the detection accuracy can be changed by adjusting the detection parameter $\alpha$.

Provided that $P_n = P_{n-1}$, then the filtered data can be calculated as $$P_n = \frac{N}{1-a}$$

based on the equation $P_n = a \cdot P_{n-1} + N$; or the filtered data can be calculated according to the following equation:

$$\begin{aligned} P_n &= a \cdot P_{n-1} + N \\ &= a \cdot (a \cdot P_{n-2} + N) + N \\ &= a^2 \cdot P_{n-2} + a \cdot N + N \\ &= \ldots \\ &= a^n \cdot P_0 + a^{n-1} \cdot N + a^{n-2} \cdot N + \ldots + N \\ &= a^n \cdot P_0 + \frac{1-a^n}{1-a} \cdot N \\ &= \frac{N}{1-a} \quad (\text{when } n \to \infty) \end{aligned}$$

If the counting information acquired by counting the clock having a standard frequency is M, then the filtered data is $$\frac{M}{1-a}.$$

In step 403, the frequency deviation of the clock to be detected is acquired from the filtered data.

In step 403, the frequency deviation of the clock to be detected is calculated according to the following equation:

$$\Delta f = \left(P_n - \frac{M}{1-a}\right) \Big/ \left(\frac{M}{1-a}\right) = \frac{(1-a)P_n}{M} - 1,$$

wherein Δf is the frequency deviation of the clock to be detected.

If the detection accuracy is determined as 1/M (M is counting information) with respect to the frequency deviation of the clock detected by the existing technology, then the detection accuracy can only be improved by increasing M. In the embodiment of the present disclosure, the minimum variation of $P_n$ is 1, the detection accuracy of the frequency deviation of the clock to be detected is $$\frac{1-a}{M},$$

and thus according to the embodiment of the present disclosure, the detection accuracy can be improved not only by increasing the current counting information M, but also by changing the detection parameter α. If the detection parameter α is set as 0.5, the detection accuracy obtained with the technical solution of the embodiment is twice of the detection accuracy obtained with the existing technology, when the clock to be detected is detected with counting clocks of the same frequency. If the detection parameter α is set as 0.9, the detection accuracy obtained with the technical solution of the embodiment is 10 times of the detection accuracy obtained with the existing technology. It has been proved through tests that in the range of 0 to 1, when α→1, the highest detection accuracy can be achieved; and smaller the value of α is (infinitely approaching to 0), the lower the detection accuracy is. Thus, according to the embodiment of the present disclosure, the detection accuracy of frequency deviation can be improved by selecting an appropriate detection parameter α.

In specific implementations, a part of the historical information is reserved in the data $P_n$ acquired by filtering the counting information, as a result, even if certain information of an abnormal condition is missed during information reading process, such information still can be acquired in subsequent information reading process. Table 1 shows a comparative example, wherein the detection parameter α is set as 0.75, and a detection result of frequency deviation is read every time when three counting results are generated.

It can be seen from Table 1 that when an abnormal value "9" appears in the counting result, the existing technology may miss the abnormal value during the periodic enquiry, referring to the data in the first and second rows in Table 1. But with the technical solution according to the embodiment of the present disclosure, the abnormal value still can be found during the same periodic enquiry. For example, in accordance with the equation $P_n = a \cdot P_{n-1} + N$, the second data of P in the third row is 16×0.75+4=16, the third data is 16×0.75+9=21, the fourth data is 21×0.75+16=19.75, the fifth data is 19.75×0.75+4=18.8, etc., and other data can also be deduced similarly, which is not illustrated herein. Thus an occurrence of abnormal dithering can be found through the historical information, and the information can be acquired in the subsequent information reading process.

The embodiment of the present disclosure filters the counting information acquired by counting the clock to be detected, calculates the frequency deviation of the clock to be detected by combining the current counting information and the historical information, improves the detection accuracy of frequency deviation by appropriately increasing the information amount, and perceives the occurrence of any abnormal dithering through the historical information, so as to avoid any neglecting of any abnormal condition during the periodic or aperiodic enquiries.

Figure 5:
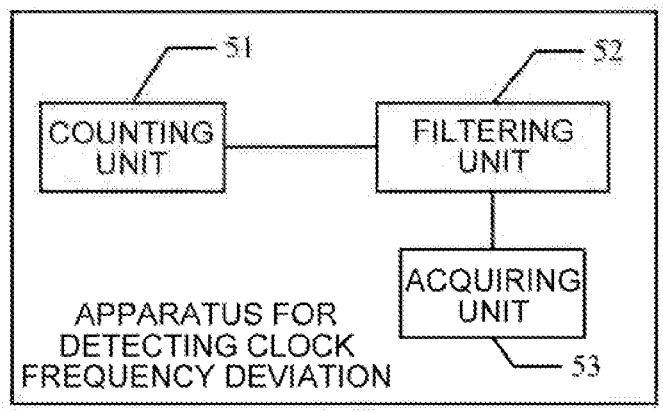
FIG. 5 is a structural diagram of an apparatus for detecting clock frequency deviation according to an embodiment of the present disclosure.

An embodiment of the present disclosure provides an apparatus for detecting frequency deviation of a clock. FIG. 5 is a structural diagram of the apparatus for detecting the frequency deviation of the clock according to the embodiment of the present disclosure. The apparatus for detecting the frequency deviation of the clock includes: (1) a counting unit 51, adapted to count the clock to be detected to acquire current counting information, wherein the counting unit may be a calculator as an example; (2) a filtering unit 52, adapted to filter the current counting information acquired by the counting unit 51 to acquire filtered data; and (3) an acquiring unit 53, adapted to acquire the frequency deviation of the clock to be detected from the filtered data acquired by the filtering unit 52.

As an example, an HF or an LF clock having a standard frequency may be adopted to count the clock to be detected with the counting unit 51; the counting unit 51 is adapted to count the clock to be detected to acquire current counting information with the HF clock having a standard frequency, or count the clock to be detected to acquire two pieces of current counting information with the LF clock having a standard frequency and the HF clock.

Referring to FIG. 1, if the counting clock is a clock having a standard frequency of fn, and the counting result of counting the clock to be detected with the counting clock in one cycle is N, the actual frequency of the LF clock to be detected is $$\frac{f_n}{N}.$$

In addition, when there is no HF clock that has a standard frequency, the LF clock having a standard frequency and the

TABLE 1

| N: | 4 → 4 → 9 → 4 → 4 → 4 → 4 → 4 → 4 → 4 → 4 → 4 → 4 → 4 → 4 → 4 → 4 |
| --- | --- |
|  | 4 ⟶ 4 ⟶ 4 ⟶ 4 ⟶ 4 ⟶ 4 |
| P: | 16 → 16 → 21 → 19.8 → 18.8 → 18.1 → 17.6 → 17.2 → 16.9 → 16.7 → 16.5 → 16.4 → 16.3 → 16.2 → 16.2 → 16.1 |
| P/4: | 4 → 4 → 5.25 → 4.94 → 4.7 → 4.53 → 4.4 → 4.3 → 4.22 → 4.17 → 4.13 → 4.09 → 4.07 → 4.05 → 4.04 → 4.03 |
|  | 4 ⟶ 4.94 ⟶ 4.4 ⟶ 4.17 ⟶ 4.07 ⟶ 4.03 | above mentioned counting clock can be adopted to count the clock to be detected, so as to acquire two counting results for comparison, and acquire the deviation of the clock to be detected, as shown in FIG. 2.

Provided that the frequency of the LF clock having a standard frequency is the expected standard frequency of the clock to be detected, the counting clock is adopted to count the LF clock having the standard frequency in one cycle, and the counting result is M.

The filtering unit 52 is adapted to acquire filtered data based on the current counting information and the data acquired after the previous filtering.

In this embodiment, the filtered data may be part or the whole of the historical information, which can be acquired in an accumulation process to be mentioned in the embodiment of the present disclosure, and such data may be the data acquired after the previous accumulation, or initialized information.

The filtering unit 52 is adapted to perform a first-order filtering to N based on an equation $P_n = a \cdot P_{n-1} + N$, wherein n is the number of accumulations, N is the nth counting information acquired by counting the clock to be detected with the clock having a standard frequency, $P_{n-1}$ is the data acquired after the n−1th filtering, Pn is the data acquired after the nth filtering, α is a detection parameter, and $0 \leq \alpha < 1$, wherein the detection parameter α can be set randomly in a certain range upon requirement.

For example, provided that $P_n = P_{n-1}$, then the filtered data $$P_n = \frac{N}{1-a}$$

can be calculated based on the equation $P_n = a \cdot P_{n-1} + N$; or the filtered data is calculated according to the following equation:

$$P_n = a \cdot P_{n-1} + N = a \cdot (a \cdot P_{n-2} + N) + N = a^2 \cdot P_{n-2} + a \cdot N + N =$$
$$\ldots = a^n \cdot P_0 + a^{n-1} \cdot N + a^{n-2} \cdot N + \ldots + N =$$
$$a^n \cdot P_0 + \frac{1-a^n}{1-a} \cdot N = \frac{N}{1-a} \quad (\text{when } n \to \infty)$$

If the counting information acquired by counting the clock having a standard frequency is M, then the filtered data is $$\frac{M}{1-a}.$$

The acquiring unit 53 is adapted to calculate the frequency deviation of the clock to be detected according to the following equation:

$$\Delta f = \left(P_n - \frac{M}{1-a}\right) \bigg/ \left(\frac{M}{1-a}\right) = \frac{(1-a)P_n}{M} - 1$$

wherein Δf is the frequency deviation of the clock to be detected.

In a specific implementation, a filtering is performed every time a counting is carried out, and the above process can be repeated to acquire the frequency deviation of the clock to be detected, until the predetermined loop condition is satisfied. The loop condition may be a preset number of accumulation, and when the preset number of accumulation reaches n, the above process will be terminated to acquire the frequency deviation of the clock to be detected. Alternatively, the loop condition may be a preset expected value of the frequency deviation of the clock to be detected, and when the preset expected value is reached, the above counting and filtering processes will be terminated.

Since the detection accuracy of the frequency deviation of the clock detected by the existing technology is determined as 1/M (M is counting information), the detection accuracy can only be improved by increasing M. In the embodiment of the present disclosure, the minimum variation of Pn is 1, and thus the detection accuracy of the frequency deviation of the clock to be detected is $$\frac{1-a}{M},$$

where $0 \leq \alpha < 1$. Thus, with the technical solution according to the embodiment of the present disclosure, the detection accuracy of frequency deviation can be improved by selecting an appropriate detection parameter α. The detailed process has been described in the embodiment of the method, and is not repeated herein.

Figure 6:
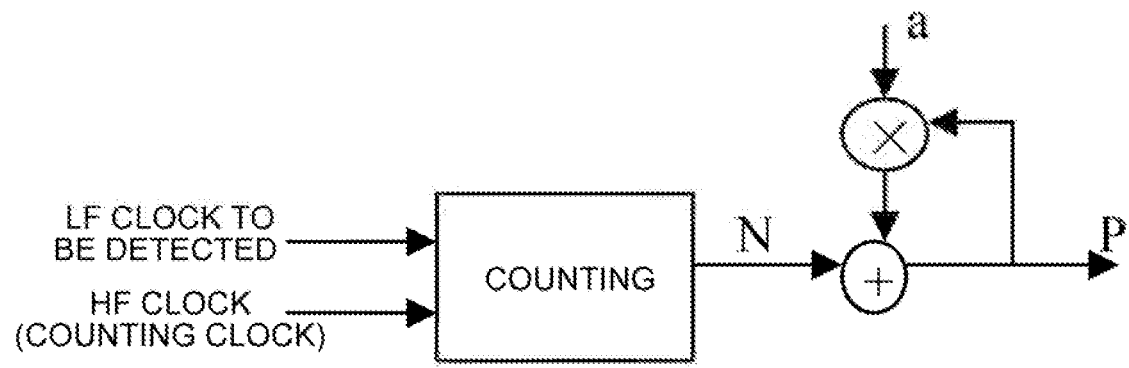
FIG. 6 is a schematic diagram of a method for detecting clock frequency deviation according to an embodiment of the present disclosure.

In the apparatus embodiment, the filtering unit 52 may be a digital filter, and may include an accumulator and a multiplier as an implementation example, wherein an appropriate value shall be selected for α, and the multiplier may be realized by shifting. FIG. 6 is the schematic diagram of the method for detecting clock frequency deviation according to an embodiment of the present disclosure.

In addition, according to the apparatus embodiment, a part of the historical information is reserved in the data Pn acquired by filtering the counting information, as a result, even if certain information of an abnormal condition is missed during information reading process, such information can still be acquired in subsequent information reading process. The details have been described in the method embodiment, and herein are not repeated.

In the embodiments of the present disclosure, the filtering process is an accumulation process, and it can implement the required filtering process.

The embodiments of the present disclosure filter the counting information acquired after counting the clock to be detected, improve the detection accuracy of frequency deviation by appropriately increasing the information amount after the filtering, and perceive the occurrence of any abnormal dithering, so as to avoid neglecting of any abnormal condition during the periodic or aperiodic enquiries.

With the above description of the embodiments, a person skilled in the art can clearly know that the present disclosure may be implemented by means of software and necessary hardware platform, and of course may also be implemented through hardware only. Accordingly, part or the whole of the technical solution of the present disclosure contributing to the existing technology can be embodied in a form of software product. The software product is stored in a storage medium, such as ROM/RAM, magnetic disk, optical disk, etc., including several instructions to enable a computer equipment (e.g., personal computer, server, network facility, etc.) to execute the embodiments of the disclosure or the method described in certain parts of the embodiments.

Herein, only preferred embodiments of the disclosure are described, and the scope to be claimed cannot be limited thereto. Thus, any equivalent change to the embodiments still falls within in the scope covered by the claims.

What is claimed is:

1. A method for detecting frequency deviation of a clock, comprising:
   counting the clock to be detected to acquire current counting information;
   filtering the current counting information to acquire filtered data; and
   acquiring the frequency deviation of the clock to be detected from the filtered data,
   wherein filtering the current counting information comprises:
   performing a first-order filtering to N based on an equation $P_n = a \cdot P_{n-1} + N$,
   wherein n is a number of accumulations, N is $n^{th}$ counting information acquired by counting the clock to be detected by a standard frequency clock, $P_{n-1}$ is data acquired after $n-1^{th}$ filtering, $P_n$ is data acquired after $n^{th}$ filtering, a is a detection parameter, and $0 < \alpha < 1$;
   wherein acquiring the frequency deviation of the clock to be detected from the filtered data comprises:
   calculating the frequency deviation of the clock to be detected according to the following equation:

$$\Delta f = \left(P_n - \frac{M}{1-a}\right) \Big/ \left(\frac{M}{1-a}\right) = \frac{(1-a)P_n}{M} - 1,$$

wherein M is counting information acquired by counting the standard frequency clock, and $\Delta f$ is the frequency deviation of the clock to be detected.

2. The method according to claim 1, wherein filtering the current counting information comprises acquiring the filtered data based on the current counting information and data acquired after the previous filtering.

3. The method according to claim 1, further comprising:
   acquiring next counting information; and
   filtering the next counting information according to the process of the filtering.

4. The method according to claim 1, wherein counting the clock to be detected to acquire the current counting information comprises:
   counting the clock to be detected by a HF clock having a standard frequency to acquire the current counting information; or
   counting the clock to be detected by a LF clock having a standard frequency and a HF clock to acquire two pieces of current counting information.

5. An apparatus for detecting frequency deviation of a clock, comprising:
   a counting unit, adapted to count the clock to be detected to acquire current counting information;
   a filtering unit, adapted to filter the current counting information acquired by the counting unit to acquire filtered data; and
   an acquiring unit, adapted to acquire the frequency deviation of the clock to be detected from the data filtered by the filtering unit,
   wherein the filtering unit is further adapted to perform a first-order filtering to N based on an equation $P_n = a \cdot P_{n-1} + N$,
   wherein n is a number of accumulations, N is $n^{th}$ counting information acquired by counting the clock to be detected by a standard frequency clock, $P_{n-1}$ is data acquired after $n-1^{th}$ filtering, $P_n$ is data acquired after $n^{th}$ filtering, a is a detection parameter, and $0 < \alpha < 1$;
   the acquiring unit is further adapted to calculate the frequency deviation of the clock to be detected according to the following equation:

$$\Delta f = \left(P_n - \frac{M}{1-a}\right) \Big/ \left(\frac{M}{1-a}\right) = \frac{(1-a)P_n}{M} - 1,$$

wherein M is counting information acquired by counting the standard frequency clock, and $\Delta f$ is the frequency deviation of the clock to be detected.

6. The apparatus according to claim 5, wherein the filtering unit is further adapted to acquire the filtered data based on the current counting information and data acquired after the previous filtering.

7. The apparatus according to claim 5, wherein the counting unit is further adapted to count the clock to be detected by an HF clock having a standard frequency to acquire the current counting information, or count the clock to be detected by an LF clock having a standard frequency and an HF clock to acquire two pieces of current counting information.

8. The apparatus according to claim 5, wherein the filtering unit is a filter.

* * * * *